(12) United States Patent
Seddon (10) Patent No.: US 11,289,380 B2
(45) Date of Patent: *Mar. 29, 2022

(54) BACKSIDE METAL PATTERNING DIE SINGULATION SYSTEMS AND RELATED METHODS

(71) Applicant: SEMICONDUCTOR COMPONENTS INDUSTRIES, LLC, Phoenix, AZ (US)

(72) Inventor: Michael J. Seddon, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/063,287

(22) Filed: Oct. 5, 2020

(65) Prior Publication Data

US 2021/0020514 A1 Jan. 21, 2021

Related U.S. Application Data (63) Continuation of application No. 16/505,860, filed on Jul. 9, 2019, now Pat. No. 10,796,963.

(Continued)

(51) Int. Cl.
| | |
|---|---|
| *H01L 21/78* | (2006.01) |
| *H01L 21/02* | (2006.01) |
| *H01L 21/311* | (2006.01) |
| *H01L 21/268* | (2006.01) |
| *H01L 21/3205* | (2006.01) |
| *H01L 21/3213* | (2006.01) |

(Continued)

(52) U.S. Cl.
CPC ........ *H01L 21/78* (2013.01); *H01L 21/02118* (2013.01); *H01L 21/268* (2013.01); *H01L 21/3065* (2013.01); *H01L 21/31127* (2013.01); *H01L 21/3247* (2013.01); *H01L 21/32051* (2013.01); *H01L 21/32131* (2013.01); *H01L 21/32134* (2013.01); *H01L 22/20* (2013.01); *H01L 23/544* (2013.01); *H01L 2223/5446* (2013.01)

(58) Field of Classification Search
None
See application file for complete search history.

(56) References Cited

U.S. PATENT DOCUMENTS 8,399,281 B1 * 3/2013 Patterson ............ H01L 31/1876
438/68
8,450,188 B1 * 5/2013 Lindsey, Jr. ........ H01L 21/6836
438/462

(Continued)

*Primary Examiner* — J. E. Schoenholtz
(74) *Attorney, Agent, or Firm* — Adam R. Stephenson, Ltd.

(57) ABSTRACT

Implementations of methods of singulating a plurality of die comprised in a substrate may include forming a plurality of die on a first side of a substrate, forming a backside metal layer on a second side of a substrate, applying a polymer layer over the backside metal layer and forming a groove entirely through the polymer layer and partially through a thickness of the backside metal layer. The groove may be located in a die street of the substrate. The method may also include etching through a remaining portion of the backside metal layer located in the die street, removing the polymer layer, singulating the plurality of die in the substrate by removing substrate material in the die street.

20 Claims, 4 Drawing Sheets

Related U.S. Application Data

(60) Provisional application No. 62/796,651, filed on Jan. 25, 2019.

(51) Int. Cl.
*H01L 21/3065* (2006.01)
*H01L 21/324* (2006.01)
*H01L 23/544* (2006.01)
*H01L 21/66* (2006.01)

(56) References Cited

U.S. PATENT DOCUMENTS

| | | | |
|---|---|---|---|
| 9,018,079 | B1 | 4/2015 | Lei |
| 9,224,650 | B2 | 12/2015 | Lei |
| 10,796,963 | B2 * | 10/2020 | Seddon ............. H01L 21/31127 |
| 10,896,819 | B2 * | 1/2021 | Noma ................. H01L 21/0275 |
| 2014/0094018 | A1 * | 4/2014 | Falvo et al. ...... H01L 21/32136 |
| | | | 438/463 |
| 2015/0145149 | A1 * | 5/2015 | Wachter ............... B23K 26/364 |
| | | | 257/787 |
| 2018/0012803 | A1 * | 1/2018 | Ventola ................. H01L 23/544 |
| 2019/0363018 | A1 | 11/2019 | Seddon |
| 2020/0152545 | A1 * | 5/2020 | Kurokawa ............ H01L 21/565 |

\* cited by examiner

BACKSIDE METAL PATTERNING DIE SINGULATION SYSTEMS AND RELATED METHODS

CROSS REFERENCE TO RELATED APPLICATIONS

This application claims the benefit of the filing date of U.S. Provisional Patent Application 62/796,651, entitled "BACKSIDE METAL PATTERNING DIE SINGULATION SYSTEMS AND RELATED METHODS" to Seddon, which was filed on Jan. 25, 2019, the disclosure of which is hereby incorporated entirely herein by reference.

This application is a continuation application of the earlier U.S. Utility patent application to Seddon entitled "Backside Metal Patterning Die Singulation Systems and Related Methods," application Ser. No. 16/505,860, filed Jul. 9, 2019, now pending, the disclosure of which is hereby incorporated entirely herein by reference.

BACKGROUND

1. Technical Field

Aspects of this document relate generally to die singulation systems and methods. More specific implementations involve methods of singulating semiconductor die from a thinned substrate.

2. Background

Semiconductor devices include integrated circuits found in common electrical and electronic devices, such as phones, desktops, tablets, other computing devices, and other electronic devices. The devices are separated through singulating a wafer of semiconducting material into a plurality of semiconductor die. Various layers may be coupled to the front side and/or the backside of the wafer. Upon singulation, the die can be mounted on a package and electrically integrated with the package which may then be used in the electrical or electronic device.

SUMMARY

Implementations of methods of singulating a plurality of die comprised in a substrate may include forming a plurality of die on a first side of a substrate, forming a backside metal layer on a second side of a substrate, applying an organic layer over the backside metal layer and forming a groove entirely through the organic layer and partially through a thickness of the backside metal layer. The groove may be located in a die street of the substrate. The method may also include etching through a remaining portion of the backside metal layer located in the die street, removing the organic layer, singulating the plurality of die in the substrate by removing substrate material in the die street.

Implementations of methods of singulating a plurality of die in a substrate may include one, all, or any of the following:

The method may include thinning the second side of the substrate.

A thickness of the backmetal layer may be 10 micrometers.

The groove may be formed using either a laser beam or a saw blade.

Etching may include wet etching through the remaining portion of the backside metal layer. The backside metal layer may be copper.

Removing substrate material in the die street may include using one of a laser beam or a saw blade.

The method may include remote plasma healing a sidewall of the die.

Removing substrate material in the die street may include plasma etching.

Implementations of methods of singulating a plurality of die in a substrate may include forming a plurality of die on a first side of a substrate, forming a backside metal layer on the second side of a substrate, applying an organic layer over the backside metal layer, forming a groove entirely through the organic layer and partially through the backside metal layer in a die street, and etching the backside metal layer. The etch may expose a portion of the substrate in the die street. The method may also include removing the organic layer and singulating the plurality of die in the substrate through plasma etching at the portion of the substrate exposed by the etching.

Implementations of methods of singulating a plurality of die in a substrate may include one, all, or any of the following:

The method may include thinning the second side of the substrate and the substrate may be thinned to less than 50 micrometers thick.

The method may include thinning the second side of the substrate and the substrate may be thinned to less than 30 micrometers thick.

The groove may be formed using either a laser beam or a saw blade.

Etching may include wet etching through the remaining portion of the backside metal layer. The backside metal layer may be copper.

A portion of the backside metal layer may be between the groove and the substrate, and the portion may have a thickness of five micrometers.

The backside metal layer may have a thickness of 10 micrometers.

Implementations of methods of singulating a plurality of die in a substrate may include forming a plurality of die on a first side of a substrate, forming a backside metal layer on the second side of a substrate, applying a photoresist layer over the backside metal layer, patterning the photoresist layer using either a laser beam or a saw blade, and forming a groove partially through the backside metal layer in a die street using either the laser beam or the saw blade. Forming the groove and patterning the photoresist layer may be done simultaneously. The method may also include etching through the backside metal layer in the die street, removing the photoresist layer, and singulating the plurality of die in the substrate through removing substrate material of the substrate in the die street.

Implementations of methods of singulating a plurality of die in a substrate may include one, all, or any of the following:

Removing substrate material in the die street may include plasma etching.

Etching may include wet etching through the remaining portion of the backside metal layer. The backside metal layer may be copper.

Removing substrate material in the die street may include using one of a laser beam or a saw blade.

The method may include monitoring the formation of the groove using a camera facing the second side of the substrate.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended die singulation systems and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such die singulation systems and related methods, and implementing components and methods, consistent with the intended operation and methods.

Figure 1:
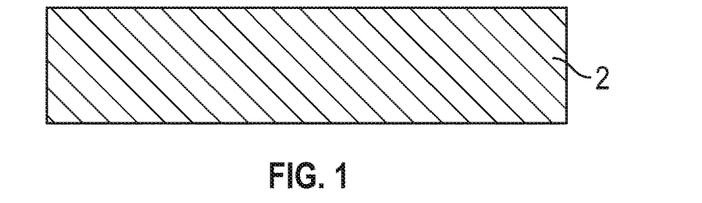
FIG. 1 is a cross sectional side view of a portion of a substrate.

Referring to FIG. 1, a cross sectional side view of a portion of a substrate 2 is illustrated. The term "substrate" refers to a semiconductor substrate as a semiconductor substrate is a common type of substrate, however, "substrate" is not an exclusive term that is used to refer to all semiconductor substrate types. Similarly, the term "substrate," may refer to a wafer as a wafer is a common type of substrate, however, "substrate" is not an exclusive term that is used to refer to all wafers. The various semiconductor substrate types disclosed in this document that may be utilized in various implementations may be, by non-limiting example, round, rounded, square, rectangular, or any other closed shape. In various implementations, the substrate 2 may include a substrate material such as, by non-limiting example, single crystal silicon, silicon dioxide, glass, gallium arsenide, sapphire, ruby, silicon-on-insulator, silicon carbide, polycrystalline or amorphous forms of any of the foregoing, and any other substrate material useful for constructing semiconductor devices. In particular implementations, the substrate may be a silicon-on-insulator substrate.

Figure 2:
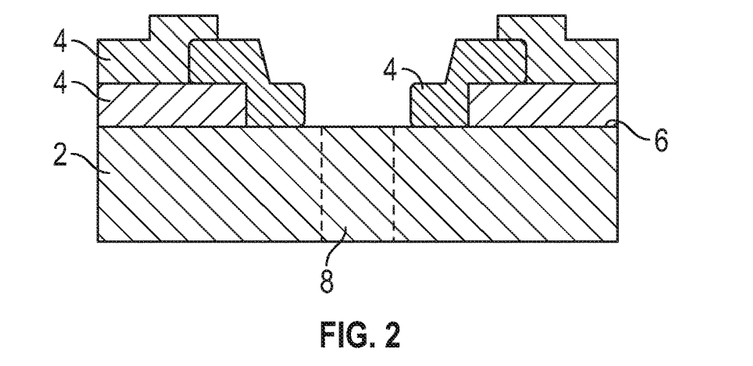
FIG. 2 is a cross sectional side view of a plurality of layers coupled to a first side of the substrate of FIG. 1.

Referring to FIG. 2, a cross sectional side view of a plurality of layers coupled to a first side of the substrate of FIG. 1 is illustrated. In various implementations, before singulating a plurality of die from the substrate 2, the method of forming a plurality of die may include forming a plurality of die on the substrate. This may include forming a plurality of layers 4 on a first side 6 the substrate 2. As illustrated by FIG. 2, the plurality of layers 4 may be patterned, and in various implementations, may be patterned (or otherwise removed) to not be over a die street 8 in the substrate 2. The plurality of layers may include, by non-limiting example, one or more metal layers, one or more passivation layers, any other layer, and any combination thereof. In various implementations passivation layers may include, by non-limiting example, silicon nitride, oxides, metal electrical test structures, electrical test pads, silicon dioxide, polyimides, metal pads, residual underbump metallization (UBM), any combination thereof, and any other layer or material capable of facilitating electrical or thermal connection between the one or more semiconductor die and/or protecting the one or more semiconductor die from contaminants. In various implementations, the plurality of die may include power semiconductor devices, such as, by non-limiting example, a MOSFET, an IGBT, or any other power semiconductor device. In other implementations, the plurality of die may include non-power semiconductor devices.

Figure 3:
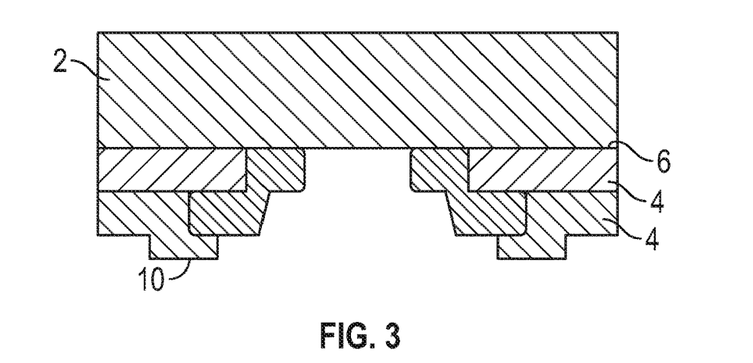
FIG. 3 is a view of the substrate and plurality of layers of FIG. 2 in a flipped orientation.
Figure 4:
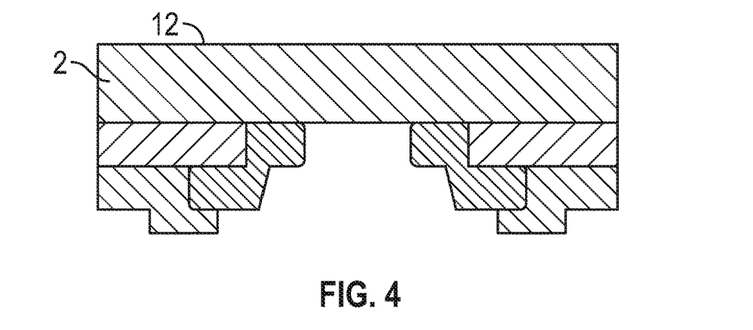
FIG. 4 is a view of the substrate and plurality of layers of FIG. 3 with the substrate thinned.

Referring to FIG. 3, a view of the substrate and plurality of layers of FIG. 2 in a flipped orientation is illustrated. The method of forming and singulating a plurality of die includes flipping the substrate and, though not illustrated, in various implementations, the method may include applying a tape to a first side 10 of the plurality of layers 4. Such a tape may be a backgrind tape in various implementations. Referring to FIG. 4, a view of the substrate and plurality of layers of FIG. 3 with the substrate thinned is illustrated. In various implementations, the method of forming and singulating a plurality of die may include thinning the second side 12 of the substrate 2. In various implementations, the substrate 2 may be thinned to a thickness less than 50 micrometers (µm). In other implementations, the substrate 2 may be thinned to a thickness less than 30 µm. In still other implementations, the substrate 2 may be thinned to a thickness less than 100 µm, more than 100 µm, and in other various implementations, the substrate 2 may not be thinned. In particular implementations, the substrate 2 may be thinned to a thickness of about 25 µm, and in other particular implementations, the substrate may be thinned to a thickness of about 75 µm. The substrate 2 may be thinned through backgrinding, etching, or any other thinning technique. In particular implementations, the substrate is thinned using a backgrinding process marketed under the trade name TAIKO by DISCO of Tokyo, Japan to form an edge ring that can support the thinned wafer.

Figure 5:
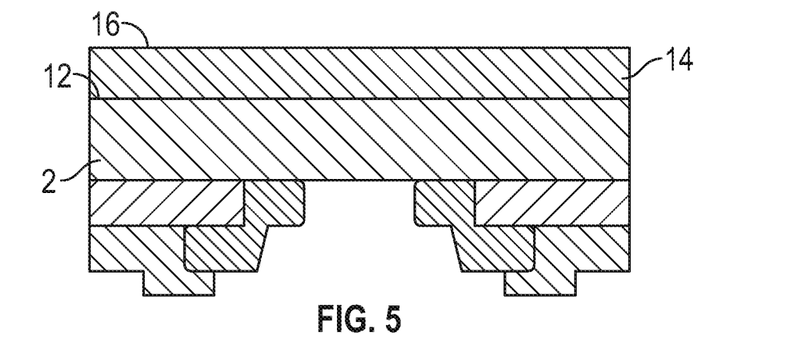
FIG. 5 is a view of the thinned substrate and plurality of layers of FIG. 4 with a backside metal layer coupled to the second side of the substrate.

Referring to FIG. 5, a view of thinned substrate and plurality of layers of FIG. 4 with a backside metal layer coupled to the second side of the substrate is illustrated. The method of forming a plurality of die and singulating the plurality of die includes forming a backside metal layer 14 on the second side 12 of the substrate 2. In particular implementations, the backside metal layer 14 may be copper or a copper alloy. In other implementations, the backside metal layer may include any other type of metal, alloy thereof, or combination thereof. In various implementations, the backside metal layer 14 may be about 10 µm thick. In other implementations, the backside metal layer may be more or less thick than 10 µm, and in particular implementations, the backside metal layer 14 may be about 15 µm thick. The backside metal layer 14 may be evaporated onto the substrate 2, however, in other implementations (including implementations having thicker substrates and/or thicker backside metal layers), the backside metal layer 14 may be plated onto the substrate 2 or formed on the substrate using another technique. In various implementations, the backside metal layer 14 may be formed over the entire second side 12 of the substrate 2. In such implementations, the backside metal layer 14 may strengthen the substrate 2.

Figure 6:
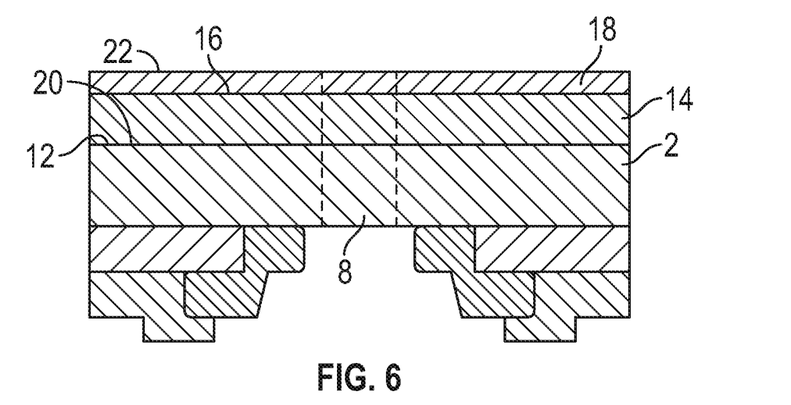
FIG. 6 is a view of a polymer layer formed over the backside metal layer of FIG. 4.

Referring to FIG. 6, a view of an organic layer formed over the backside metal layer of FIG. 4 is illustrated. In various implementations, the organic layer may include, by non-limiting example, a polymer, resin, photoresist, any combination thereof, or any other carbon-containing compound or mixture. The method of forming a plurality of die and singulating the plurality of die includes applying an organic/polymer layer 18 over the backside metal layer 14, and in various implementations, over the entire second side 16 of the backside metal layer 14. In various implementations, the polymer layer 18 may be directly coupled to the second side 16 (opposite the first side 20) of the backside metal layer 14. While the implementations disclosed herein refer to applying a polymer layer 18 over the backside metal layer 14, it is understood that in other implementations other layers, such as a non-polymer photoresist layer, may be used. In such implementations, the other layers are resistant to a wet etch used to remove the backside metal layer 14 as disclosed later herein. While it is understood that a photoresist layer may be used in place of the polymer layer, in various implementations a basic and inexpensive polymer layer may be used rather than a more expensive photoresist layer as the method of singulating a plurality of die does not include a exposing or developing processing step. Thus, there may be no need to use a expensive photoresist material in various method implementations. In various implementations, the method may include applying the polymer layer 18 through spin coating or spraying the polymer layer 18 onto the backside metal layer 14. In various implementations, the polymer layer 18 may be about 1 µm thick, however, in other implementations the polymer layer may be less than or more than 1 µm thick.

Prior to any actual singulation of a plurality of the die, the method of singulating the plurality of die in the substrate may include aligning the substrate. In various implementations, the method may include aligning the substrate from the first side (which may be the front side, or bottom side as oriented in FIG. 6) using optics or a camera. In such implementations, the optics or camera may be placed below the substrate and may detect a plurality of alignment features formed on or within the substrate. In various implementations, the alignment features may be formed on or within the die street 8 of the substrate. In implementations having tape coupled to the first side 10 of the plurality of layers, the optics or camera may be configured to detect the plurality of alignment features through the tape. In a particular implementation, the substrate may be aligned using an infrared (IR) camera and IR alignment features. In other implementations, the substrate may be aligned from the backside, or second side 12 of the substrate. In such implementations, alignment features may be placed on the polymer layer 18 covering the backside metal layer 14. Such features may be placed according to corresponding alignment features on the front side of the substrate. In other implementations where the substrate includes a ring around the perimeter after thinning the substrate, the method of aligning the substrate may include placing alignment features in the periphery of the substrate and grinding down the perimeter ring. The substrate may then be aligned from the backside, or second side 12 of the substrate by using the alignment features along the outer edge of the device. Such an alignment method may include using IR spectroscopy.

Figure 7:
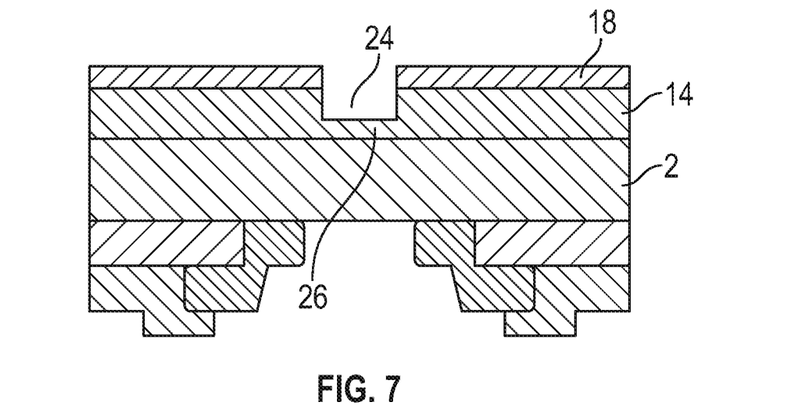
FIG. 7 is a view of the backside metal layer of FIG. 6 having a groove formed partially therein.

Referring to FIG. 7, a view of the backside metal layer of FIG. 6 having a groove formed partially therein is illustrated. The method of singulating a plurality of die in a substrate includes forming a groove 24 in the die street 8 entirely through the polymer layer 18 and partially through a thickness of the backside metal layer 14. In such implementations, a portion 26 of the backside metal layer 14 may remain between the groove 24 and the substrate 2. In this manner, the formation of the groove 24 is prevented from extending into the substrate 2, and in turn, may prevent damage to the substrate. In various implementations, the portion 26 may have a thickness of 5 µm, while in other implementations the portion 26 may have a thickness of more than or less than 5 µm. Similarly, in various implementations the groove 24 may be 6 µm deep, while in other implementations the groove 24 may be more or less deep than 6 µm. In various implementations, the groove 24 may be as wide as the die street 8 or wider than the die street. The groove 24 may be formed through, by non-limiting example, a laser beam, a saw blade, a scribing stylus, or through jet ablation.

Because the polymer layer 18 within the die street 8 is removed at the same time the groove 24 is formed, there is no need to use an expose and develop step with a photosensitive material to pattern the material. Indeed, the polymer layer 18 is patterned using the laser beam, saw blade, or other mechanism used to form the groove 24. In this manner the polymer layer 18 (or in various implementations, the photoresist layer) is patterned simultaneously with the formation of the groove 24.

In order to ensure that the formation of the groove leaves the portion 26 between the groove 24 and the substrate 2, care may be required to prevent the formation of the groove into the substrate or over thinning of the portion 26. In order to facilitate the formation of the groove 24 not extending entirely through the backside metal layer 14 or over thinning the portion 26, in various implementations the method of singulating a plurality of die in a substrate may include actively monitoring the formation of a groove 24 in the backside metal layer 14. In various implementations, a camera facing the polymer layer 18 may be used to actively monitor the formation of the groove 24. Active monitoring may include monitoring the cleared backside metal and/or measuring the thickness variation of the removed backside metal layer as compared to the original thickness of the backside metal layer. In such implementations, the method for singulating the plurality of die may include making near-real-time adjustments to one or more laser parameters (or other grooving tool disclosed herein) using data collected during the active monitoring of the formation of the groove 24.

In particular implementations, near-real-time may include the camera monitoring the formation of the groove 24 one inch behind the laser beam or saw blade (or other element forming the groove, such as a scribing stylus or water jet), and, based upon the data collected from the monitoring, immediately making adjustments to the parameters of the laser beam or saw blade. In other implementations, near-real-time may include the camera actively monitoring the formation of the groove less than one inch behind the laser beam or saw blade or more than one inch behind the laser beam or saw blade. The parameters of the laser beam which may be adjusted may include, by non-limiting example, laser power, pulse, focal point, and/or speed of movement of the laser beam across the backside metal layer 14. Similarly, if a saw blade, scribing stylus, or water jet is used to form the groove 24 parameters of the saw blade, scribing stylus, or water jet, such as speed or depth of the saw blade, speed or pressure of the stylus, or speed or pressure of the water jet may be adjusted to prevent forming the groove through an entire thickness of the backside metal layer 14. In various implementations, especially implementations having a thinned substrate, active monitoring of the formation of the groove 24 may be critical as the process window for forming the groove may be more narrow. This is because the thickness of the tape itself may vary by about 5 microns or more across the width of the substrate due to variations in the tape and the adhesive. Through such active monitoring and near-real-time adjustments, any tilt in the substrate or chuck and any variations in the thickness of the tape and adhesive may be compensated for by adjusting the parameters of the laser, saw, or other groove forming mechanism. In this manner, the backside metal layer 14 may have a groove 24 formed partially through the thickness of the backside metal layer without the groove being formed into the substrate 2. Further, the portion 26 left between the groove 24 and the substrate 2 may have a continuous thickness which may prevent the wet etch of the portion 26 disclosed later herein from extending into the substrate 2.

Figure 8:
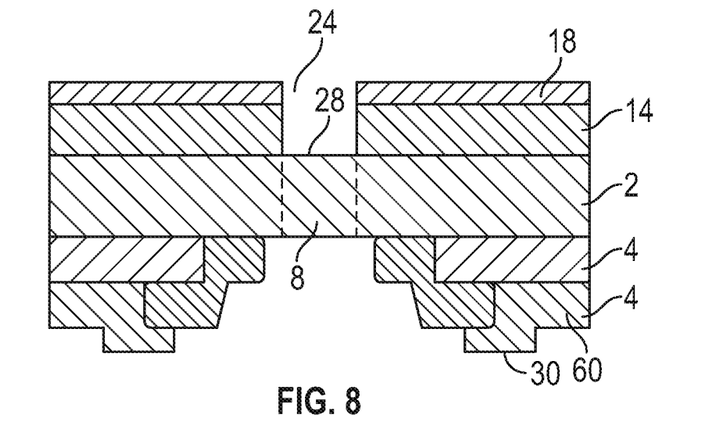
FIG. 8 is a view of the backside metal layer of FIG. 7 having a groove formed entirely therethrough.

Referring to FIG. 8, a view of the backside metal layer of FIG. 7 having a groove formed entirely therethrough is illustrated. In various implementations, the method of singulating a plurality of die may include etching through the remaining portion 26 of the backside metal layer 14 in the die street 8. The etch may be applied to the portion 26 within the groove 24 without etching the rest of the second side 16 of the backside metal layer 14 as the rest of the second side of the backside metal layer is protected by the polymer layer 18. In various implementations, the etch may expose a portion 28 of the substrate 2 in the die street 8. In various implementations, the etch applied within the groove 24 may be a wet etch and may be sprayed into the groove 24. In other implementations the wet etch may be applied using a method other then spraying, such as, by non-limiting example, bath, tank, or dunk etching. In various implementations, though not illustrated, tape may be applied to the front side, or outer surface 30 of the plurality of layers 4. The tape may protect the pads 60 of the plurality of die from the etch.

Figure 9:
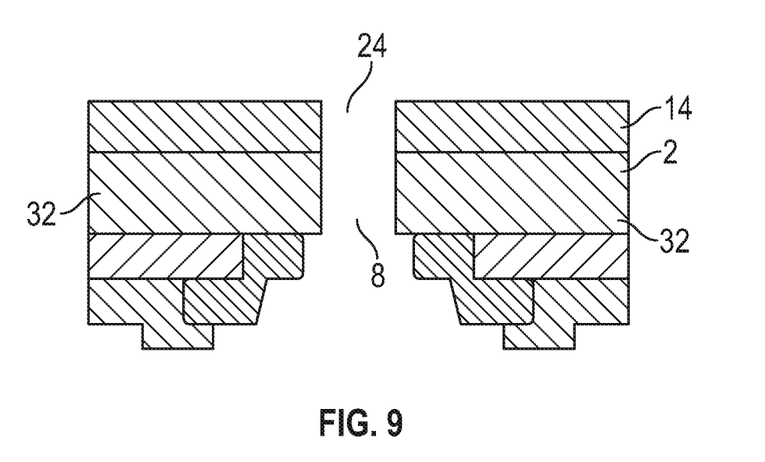
FIG. 9 is a view of the substrate of FIG. 8 singulated into a plurality of die.

Referring to FIG. 9, a view of the substrate of FIG. 8 singulated into a plurality of die is illustrated. In various implementations, and as illustrated by FIG. 9, the method of singulating a plurality of die in a substrate includes removing the polymer layer 18. In various implementations, the polymer layer 18 may be removed through, by non-limiting example, an plasma ashing process or a solvent stripping process. In such implementations, any slag on the polymer layer resulting from laser ablating the groove 24 may be removed along with the polymer layer 18. Thus, in such an implementation, the polymer layer may result in a cleaner die as the slag may be removed during the removal of the polymer layer 18.

In various implementations, the plurality of die 32 may be singulated through removing the substrate material of the substrate 2 in the die street 8. The substrate material may be removed through plasma etching at the portion 28 of the substrate 2 exposed by the etching. In various implementations, a plasma etch process marketed under the tradename BOSCH® by Robert Bosch GmbH, Stuttgart Germany (the "Bosch process"), may be used to singulate the substrate 2 into a plurality of die 32. In other implementations, other plasma etch processes may be used to singulate the plurality of die 32 from the substrate 2. In various implementations, though not illustrated, singulating the plurality of die 32 included in the substrate through plasma etching may include removing a portion of the substrate material of the substrate having a width less than a width of the die street, or groove. In such implementations, the width of the removed portion from plasma etching is less than the width of the die street as plasma die singulation is capable of creating a die street more narrow than the die street created through a laser beam or a saw. In other implementations, and as illustrated by FIG. 9, the width of the removed substrate material in the die street 8 may be the same as the width of the die street by singulating the plurality of die 32 through removing through plasma etch all of the substrate material of the substrate 2 in the die street 8.

Figure 10:
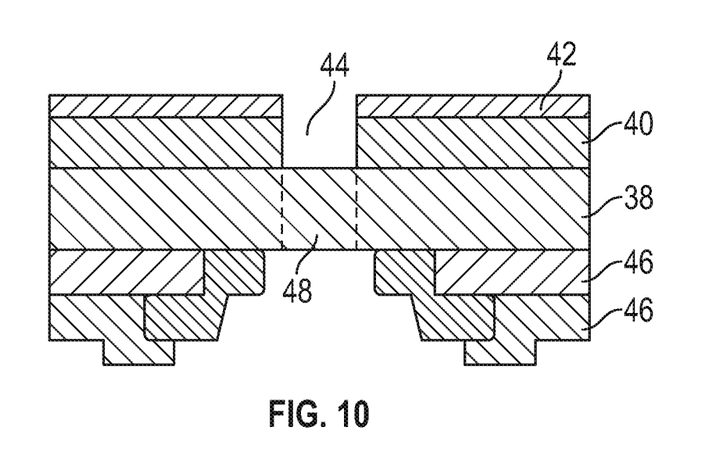
FIG. 10 is a view of a backside metal layer having a groove formed entirely therethrough.
Figure 11:
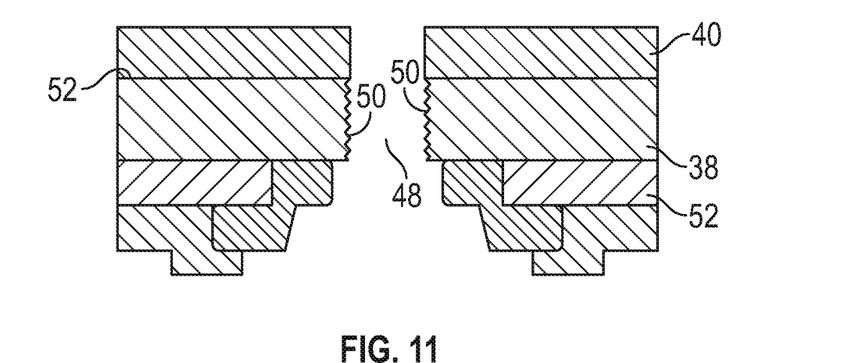
FIG. 11 is a view of the substrate of FIG. 10 singulated into a plurality of die.
Figure 12:
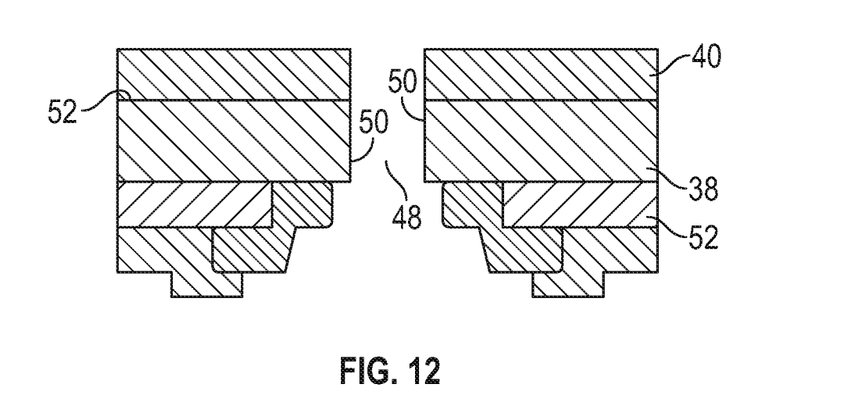
FIG. 12 is a view of the plurality of die of FIG. 11 having smooth sidewalls.

Referring to FIG. 10, a view of a backside metal layer having a groove formed entirely therethrough is illustrated. The substrate 38, backside metal layer 40, polymer layer 42, groove 44, and plurality of layers 46 may be the same as or similar to the substrate, backside metal layer, polymer layer, groove, and plurality of layers illustrated by FIG. 8. Further, the substrate 38, backside metal layer 40, polymer layer 42, groove 44, and plurality of layers may be formed using any method previously disclosed herein. Referring to FIG. 11, a view of the substrate of FIG. 10 singulated into a plurality of die is illustrated. In various implementations, and as previously disclosed herein, the method of singulating a plurality of die in a substrate includes removing the polymer layer 42. The polymer layer 42 may be removed using any method disclosed herein. Further, the method of singulating a plurality of die includes removing substrate material in the die street 48. In various implementations, and as illustrated by FIG. 11, the substrate material in the die street 48 may be removed using either a laser beam or a saw blade. In such implementations, the laser beam or saw blade may result in roughened sidewalls 50 of the die street 48 or of the plurality of die 52. In such implementations, the method of singulating a plurality of die 52 from the substrate may include remote plasma healing a sidewall of each die (or sidewall 50 of the die street 48) of the plurality of die. Referring to FIG. 12, a view of the plurality of die of FIG. 11 having smoothed sidewalls is illustrated. In various implementations, the method of singulating the plurality of die may include removing damage from a sidewall 50 of the die street 48 through remote plasma healing. In such implementations, an isotropic plasma etch may be applied to the sidewalls 50 of the die street 48. The plasma may penetrate/facilitate reaction with the materials of the cracks and/or chips of the sidewalls 50 formed when the plurality of die 52 were singulated from the substrate 38. As the plasma enters the cracks and/or chips, the damaged portion of the substrate 38 may etch away and result in smoothed, or healed, sidewalls 50 of the die street 48, as illustrated by FIG. 12.

In other implementations, a laser beam or saw blade may be used to singulate a plurality of die without passing entirely through the backside metal layer. In such implementations, the laser beam or saw blade may remove any remaining backside metal layer material in the saw street along with any substrate material in the saw street. In various implementations, the two-step laser ablation process may prevent re-deposition of the backside metal layer into the substrate as the backside metal layer in the die street will be cleared away prior to the singulation of the plurality of die.

In various implementations, the method of singulating a plurality of die from a substrate may include depositing a diffusion barrier layer between the backside metal layer and the substrate. In such implementations, the diffusion barrier layer may serve as an etch stop when the portion of the backside metal layer in the die street is etched. The diffusion barrier layer may also prevent migration of the backside metal layer into the substrate during the etch. In implementations having a diffusion barrier layer, the portion of the diffusion barrier layer in the die street may be removed using a laser beam or a saw blade. In such implementations, the method of singulating a plurality of die from a substrate may include removing substrate material of the substrate in the die street using any method of removing substrate material disclosed herein.

In the various implementations disclosed herein, by removing or reducing the thickness of the backside metal layer in the die street, the risk of re-deposition of the backside material along the sidewalls of each die of the plurality of die is reduced. Further, because various implementations disclosed herein include methods of singulating a plurality of die from a second side, or backside of the substrate, there is no need to flip the substrate over in order to singulate the substrate from the first side, or side having the plurality of die formed thereon. The ability to singulate the die from the backside may reduce damage to the substrate, and especially a thinned substrate, as it requires the substrate to be handled less. This may have the effect of increasing the yield of the overall process.

In places where the description above refers to particular implementations of die singulation systems and related methods and implementing components, sub-components, methods and sub-methods, it should be readily apparent that a number of modifications may be made without departing from the spirit thereof and that these implementations, implementing components, sub-components, methods and sub-methods may be applied to other die singulation systems and related methods.

What is claimed is:

1. A method of singulating a plurality of die comprised in a substrate, the method comprising:
    forming a plurality of die on a first side of a substrate;
    forming a backside metal layer on a second side of the substrate;
    applying a layer over the backside metal layer;
    forming a groove entirely through the layer and partially through a thickness of the backside metal layer, wherein the groove is located in a die street of the substrate;
    actively monitoring a formation of the groove;
    etching through a remaining portion of the backside metal layer located in the die street;
    removing the layer; and
    singulating the plurality of die comprised in the substrate by removing substrate material in the die street.

2. The method of claim 1, further comprising thinning the second side of the substrate.

3. The method of claim 1, wherein a thickness of the backside metal layer is 10 micrometers.

4. The method of claim 1, wherein the groove is formed using one of a laser beam or a saw blade.

5. The method of claim 1, wherein etching further comprises wet etching through the remaining portion of the backside metal layer, wherein the backside metal layer comprises copper.

6. The method of claim 1, wherein removing substrate material in the die street further comprises using one of a laser beam or a saw blade.

7. The method of claim 6, further comprising remote plasma healing a sidewall of the plurality of die.

8. The method of claim 1, wherein removing substrate material in the die street further comprises plasma etching.

9. The method of claim 1, wherein the layer comprises an organic layer coupled over the backside metal layer.

10. A method of singulating a plurality of die comprised in a substrate, the method comprising:
    forming a plurality of die on a first side of a substrate;
    forming a backside metal layer on a second side of the substrate;
    applying a layer over the backside metal layer;
    forming a groove entirely through the layer and partially through the backside metal layer in a die street;
    actively monitoring a formation of the groove using a camera facing the second side of the substrate;
    etching the backside metal layer, wherein the etching exposes a portion of the substrate in the die street;
    removing the layer; and
    singulating the plurality of die comprised in the substrate through plasma etching at the portion of the substrate exposed by the etching.

11. The method of claim 10, further comprising thinning the second side of the substrate, wherein the substrate is thinned to less than 50 micrometers thick.

12. The method of claim 10, further comprising thinning the second side of the substrate, wherein the substrate is thinned to less than 30 micrometers thick.

13. The method of claim 10, wherein the groove is formed using one of a laser beam or a saw blade.

14. The method of claim 10, wherein etching further comprises wet etching the backside metal layer, wherein the backside metal layer comprises copper.

15. The method of claim 10, wherein a portion of the backside metal layer is between the groove and the substrate, the portion having a thickness of five micrometers.

16. The method of claim 10, wherein the backside metal layer has a thickness of 10 micrometers.

17. A method of singulating a plurality of die comprised in a substrate, the method comprising:
    forming a plurality of die on a first side of a substrate;
    forming a backside metal layer on a second side of the substrate;
    applying a photoresist layer over the backside metal layer;
    patterning the photoresist layer using one of a laser beam or a saw blade;
    forming a groove partially through the backside metal layer in a die street using one of the laser beam or the saw blade;
    actively monitoring a formation of the groove using a camera facing the second side of the substrate;
    etching through the backside metal layer in the die street;
    removing the photoresist layer; and
    singulating the plurality of die comprised in the substrate through removing substrate material of the substrate in the die street.

18. The method of claim 17, wherein removing substrate material in the die street further comprises plasma etching.

19. The method of claim 17, wherein etching further comprises wet etching through the backside metal layer, wherein the backside metal layer comprises copper.

20. The method of claim 17, wherein removing substrate material in the die street further comprises using one of a laser beam or a saw blade.

* * * * *